United States Patent
Kato et al.

(10) Patent No.: US 9,860,995 B2
(45) Date of Patent: Jan. 2, 2018

(54) SOLDER SUPPLY SYSTEM

(71) Applicant: FUJI MACHINE MFG. CO., LTD., Chiryu (JP)

(72) Inventors: Mitsuaki Kato, Anjo (JP); Yoji Fujita, Okazaki (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 15/119,776

(22) PCT Filed: Feb. 26, 2014

(86) PCT No.: PCT/JP2014/054700
§ 371 (c)(1),
(2) Date: Aug. 18, 2016

(87) PCT Pub. No.: WO2015/128967
PCT Pub. Date: Sep. 3, 2015

(65) Prior Publication Data
US 2017/0055351 A1     Feb. 23, 2017

(51) Int. Cl.
*H05K 3/34* (2006.01)
*B23K 3/06* (2006.01)
*B23K 3/08* (2006.01)
*B23K 101/42* (2006.01)

(52) U.S. Cl.
CPC ......... *H05K 3/3478* (2013.01); *B23K 3/0638* (2013.01); *B23K 3/08* (2013.01); *B23K 2201/42* (2013.01); *H05K 3/3484* (2013.01); *H05K 2203/0126* (2013.01)

(58) Field of Classification Search
CPC ... B23K 3/0638; B23K 1/0016; H05K 3/1233
USPC .................................................. 137/565.01
See application file for complete search history.

(56) References Cited

U.S. PATENT DOCUMENTS

2007/0070148 A1    3/2007   Hattori et al.

FOREIGN PATENT DOCUMENTS

| JP | 11-157098 A | 6/1999 |
|---|---|---|
| JP | 11-320823 A | 11/1999 |
| JP | 2008-207392 A | 9/2008 |
| JP | 2010-158906 A | 7/2010 |
| JP | 2010-172928 A | 8/2010 |
| JP | 2011-31301 A | 2/2011 |

OTHER PUBLICATIONS

International Search Report dated May 20, 2014 for PCT/JP2014/054700 filed Feb. 26, 2014.
Office Action issued Sep. 19, 2017 in Japanese Patent Application No. 2016-504914 (with English translation).

*Primary Examiner* — Erin Saad
(74) *Attorney, Agent, or Firm* — Oblon, McClelland, Maier & Neustadt, L.L.P.

(57) ABSTRACT

A solder supply system that judges whether a solder cup is set on a solder supply device. In a case in which it is judged that the solder cup is set on the solder supply device, reading a barcode by a barcode reader is allowed. In contrast, in a case in which it is judged that the solder cup is not set on the solder supply device, reading a barcode by the barcode reader is restricted. That is, reading a barcode by the barcode reader before the solder cup is set inside an outer tube is restricted, while reading a barcode by the barcode reader is allowed when the solder container is set inside the outer tube.

8 Claims, 5 Drawing Sheets

SOLDER SUPPLY SYSTEM

TECHNICAL FIELD

The present disclosure relates to a solder supply system provided with a solder supply device for supplying solder from a solder container housing liquid solder, the solder container being tubular and open at one end.

BACKGROUND ART

Among solder supply devices, there is a solder supply device that has a solder container housing liquid solder inside thereof, and a piston engaged inside the solder container, and that supplies solder in the solder container by raising the pressure inside the solder container by moving at least one of the solder container and the piston. With this type of device, when a solder container becomes empty, the empty solder container is exchanged with a new solder container. Here, conventionally verification work is performed of new solder containers. With the solder supply system according to the patent literature below, verification work of solder containers is performed by reading a barcode affixed to the solder container with a barcode reader.

Patent literature 1: JP-A-Heisei 11-320823

SUMMARY

According to the solder supply system of the above patent literature, it is possible to perform verification work of solder containers appropriately to a certain extent. However, there are cases in which operator mistakes are not prevented, such that solder verification work is not performed appropriately. Specifically, for example, there are cases in which an operator, intending to house solder cup A in a solder supply device, reads the barcode of solder cup A with the barcode reader, but then proceeds to house solder cup B in the solder supply device. In this case, verification work of the solder container is not performed appropriately. The present disclosure takes account of such problems and an object thereof is to provide a solder supply system that prevents operator mistakes and allows verification work of solder containers to be performed appropriately.

To solve the above problems, the solder supply system disclosed in claim 1 is a solder supply system comprising: a solder supply device including (a-1) a solder container housing liquid solder that is tubular and open at one end, (a-2) a nozzle, for ejecting solder from the solder container, that is inserted into the solder container, and (a-3) a piston that is fixedly provided on an outer circumferential section of the nozzle and that is engaged inside of the solder container from the opening of the solder container, wherein the solder supply device supplies solder from the tip of the nozzle by moving at least one of the solder container and the piston such that the piston advances inside the solder container; a reading device for reading an identification code affixed to the solder container; and a control device including (b-1) a judging section that judges whether the solder container is set in the solder supply device, and (b-2) a reading device control section that restricts reading of the identification code by the reading device in a case in which the judging section judges that the solder container is not set in the solder supply device.

Further, the solder supply system disclosed in claim 2 is the solder supply system according to claim 1, wherein the judging section judges whether the solder container is set in a position at which solder can be supplied, and the reading device control section allows reading of the identification code by the reading device in a case in which the judging section judges that the solder container is set in a position at which solder can be supplied.

Further, the solder supply system disclosed in claim 3 is the solder supply system according to claim 1 or claim 2, wherein the solder supply device includes an outer tube that houses the solder container along with the nozzle and the piston, and at least a portion of the outer tube is transparent, such that the identification code affixed to the solder container housed inside the outer tube is viewable from outside the outer tube.

Further, the solder supply system disclosed in claim 4 is the solder supply system of claim 3, wherein the judging section judges whether the solder container is set in the solder supply device using a detection sensor that detects light that passes through the transparent portion of the outer tube.

Further, the solder supply system disclosed in claim 5 is the solder supply system according to any one of the claims 1 to 4, wherein the control device includes a reporting section that reports a reading request of the identification code by the reading device when the judgment of the judging section changes from a judgment indicating that the solder container is set in the solder supply device to a judgment indicating that the solder container is not set in the solder supply device.

ADVANTAGEOUS EFFECTS

According to the solder supply system disclosed in claim 1, it is judged whether the solder container is set in the solder supply device. Also, in a case in which it is judged that the solder container is not set in the solder supply device, for example, reading of an identification code such as a barcode by a reading device such as a barcode reader is restricted. That is, before a solder container is set the solder supply device, reading of the identification code by the reading device is restricted. Thus, verification work is only able to be performed for solder containers actually set on the solder supply device, which prevents operator mistakes and enables verification work of solder containers to be performed appropriately.

Further, according to the solder supply system disclosed in claim 2, in a case in which it is judged that the solder container is set in the solder supply device, for example, reading of an identification code such as a barcode by a reading device such as a barcode reader is allowed. Thus, it is possible to perform verification work reliably only with respect solder containers that are set in the solder supply device in a state ready to supply solder.

Further, according to the solder supply system disclosed in claim 3, the solder container is housed inside an outer tube along with a nozzle and a piston. At least a portion of the outer tube is transparent, such that the barcode affixed to the solder container housed inside the outer tube is viewable from outside the outer tube. Thus, it is possible to read the barcode from outside the tube using the barcode reader, which allows verification work of a solder container set in the solder supply device to be performed appropriately.

Further, according to the solder supply system disclosed in claim 4, it is judged whether the solder container is set in the solder supply device by a detection sensor that detects light that passes through the transparent portion of the outer tube. Thus, it is possible to appropriately judge whether the solder container is set in the solder supply device.

Further, according to the solder supply system disclosed in claim 5, a reading request for a barcode to be read by a barcode reader is reported when the judgment changes from a judgment indicating that the solder container is set in the solder supply device to a judgment indicating that the solder container is not set in the solder supply device. Thus, it is possible to ensure that verification work is not forgotten.

DESCRIPTION OF PREFERRED EMBODIMENTS

The following describes in detail referring to the figures an example embodiment of the present disclosure.

Configuration of Solder Printer

Figure 1:
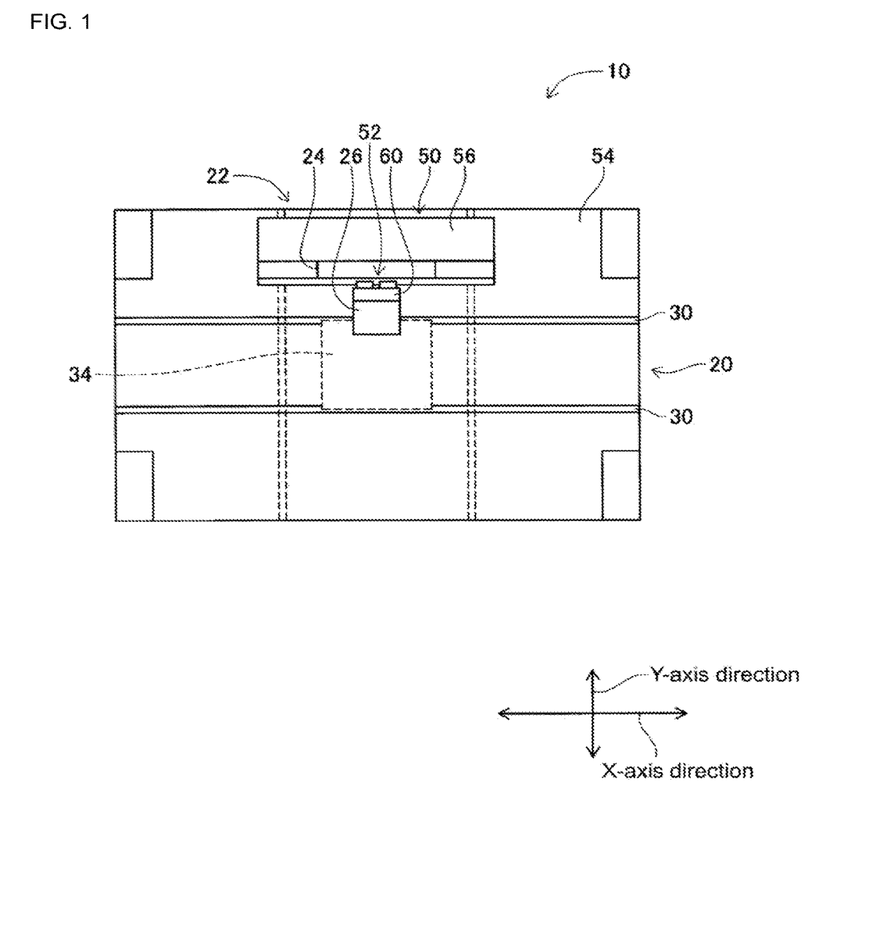
FIG. 1 is a plan view showing a solder printer of an embodiment.

FIG. 1 shows solder printer 10 as an embodiment of the disclosure. Solder printer 10 is a device that prints solder paste onto a circuit board. Solder printer 10 is provided with conveyance device 20, moving device 22, squeegee device 24, and solder supply device 26.

Conveyance device 20 has a pair of conveyor belts 30 that extend in the X-axis direction, and electromagnetic motor (refer to FIG. 4) 32 that moves conveyor belts 30. The pair of conveyor belts 30 support circuit board 34 and circuit board 34 is conveyed in the X-axis direction by the driving of electromagnetic motor 32. Also, conveyance device 20 has holding device (refer to FIG. 4) 36. Holding device 36 fixedly holds circuit board 34 supported by conveyor belts 30 in a predetermined position (the position at which circuit board 34 is shown in FIG. 1). Note that a metal mask (not shown) is loaded on the upper surface of circuit board 34.

Moving device 22 is configured from Y-axis direction slide mechanism 50 and X-axis direction slide mechanism 52. Y-axis direction slide mechanism 50 has Y-axis slider 56 provided on base 54 so as to be movable in the Y-axis direction. Y-axis slider 56 is moved to any position in the Y-axis direction by the driving of electromagnetic motor (refer to FIG. 4) 58. Also, X-axis direction slide mechanism 52 has X-axis slider 60 provided on a side surface of Y-axis slider 56 to be movable in the X-axis direction. X-axis slider 60 is moved to any position in the X-axis direction by the driving of electromagnetic motor (refer to FIG. 4) 62.

Squeegee device 24 is attached to Y-axis slider 56 about conveyance device 20, and moves to any position above circuit board 34 that is held by conveyance device 20. Squeegee device 24 has a squeegee (not shown) and the squeegee is held extending downwards by squeegee device 24 to be movable in the Y-axis direction and the up/down directions. Further, the squeegee is moved in the Y-axis direction by the driving of electromagnetic motor (refer to FIG. 4) 66, and is moved up/down by the driving of electromagnetic motor (refer to FIG. 4) 68.

Figure 2:
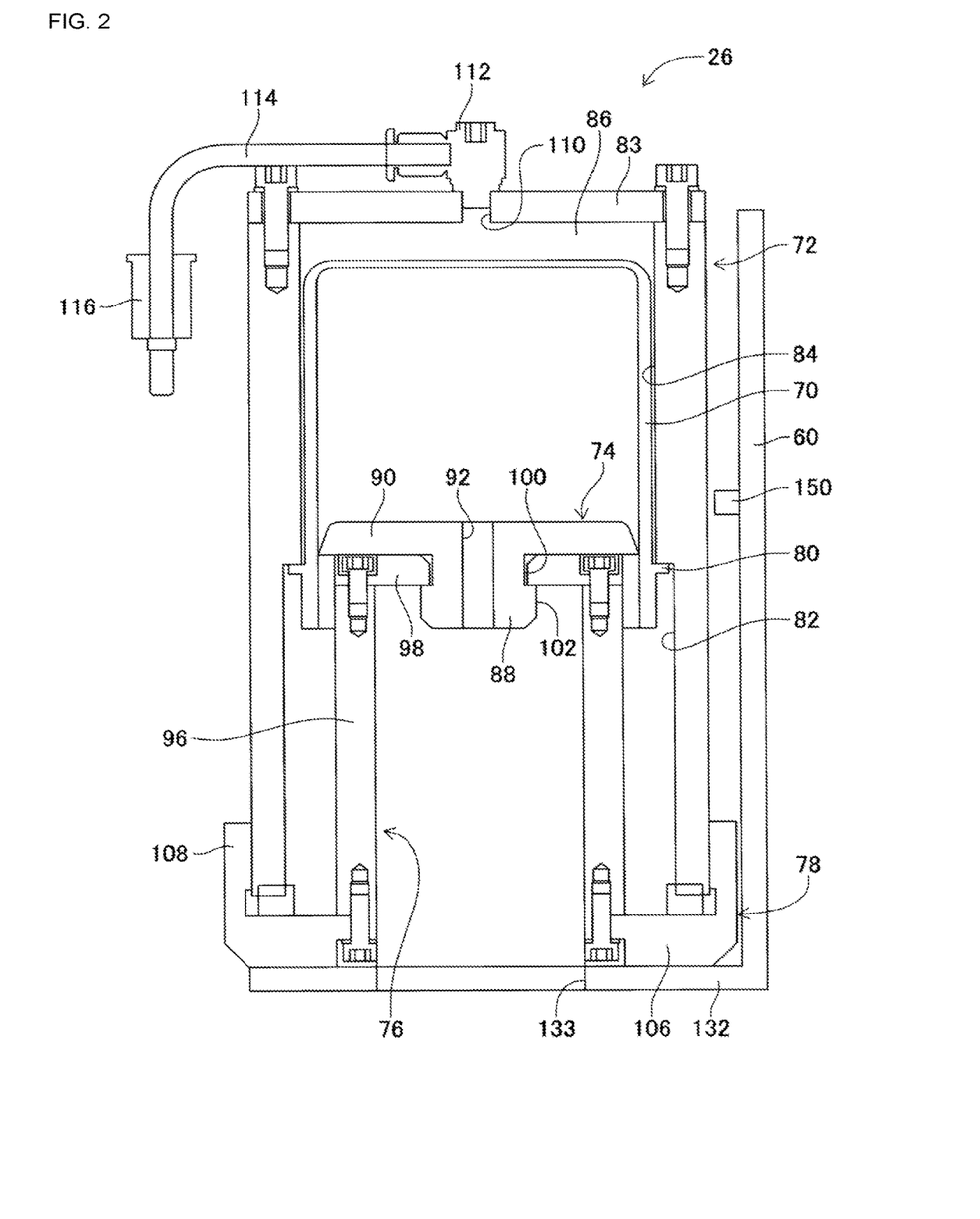
FIG. 2 is a cross-section view showing a solder supply device provided in the solder printer of FIG. 1.
Figure 3:
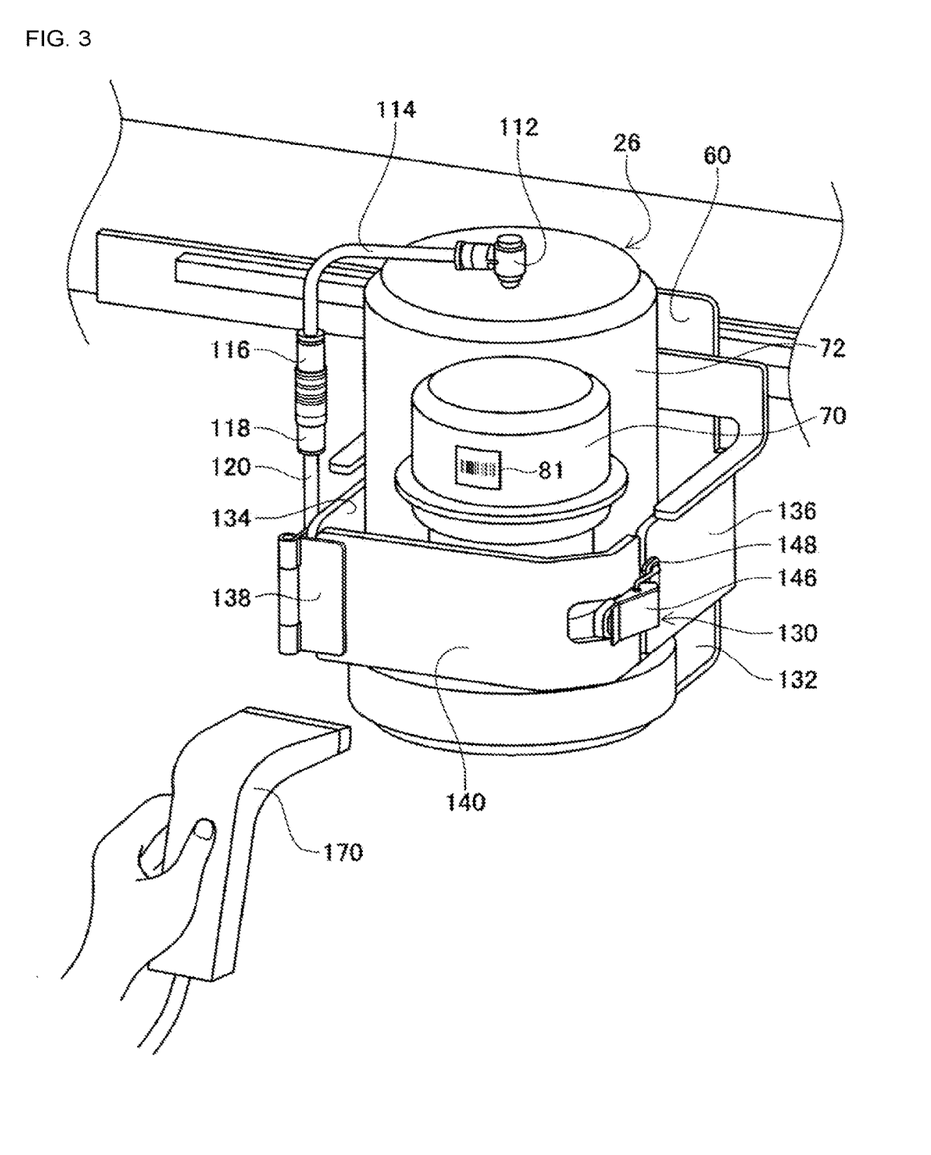
FIG. 3 is a perspective view showing the solder supply device of FIG. 2.

Solder supply device 26 is attached to X-axis slider 60 and is moved to any position above base 54 by moving device 22. As shown in FIG. 2, solder supply device 26 has solder cup 70, outer tube 72, supply nozzle 74, inner tube 76, and fixed lid 78. Solder cup 70 is a bottomed cylindrical container with an opening at one end; solder cup 70 is filled with solder paste. Flange section 80 is formed on the outer circumferential surface at the opening side of solder cup 70; a screw thread (not shown) is formed between flange 80 and the edge of the opening side. Solder cup 70 is sold commercially with a lid (not shown) that engages with the screw thread covering the opening. That is, solder paste manufacturers sell solder cups 70 after filling solder cups 70 with solder paste and covering the opening with a lid. Users purchase solder cups 70 and use them with the lid removed. Note that, as shown in FIG. 3, identification sticker 81 with a barcode is affixed to a side surface of solder cup 70.

Also, as shown in FIG. 2, outer tube 72, similar to solder cup 70, is a bottomed cylinder with an opening at one end; solder cup 70 is stored inside outer tube 72. In detail, the inner circumferential surface of outer tube 72 is configured from first inner circumferential surface 82 that is positioned at the opening side of outer tube 72, and second inner circumferential surface 84 that is positioned at bottom surface 83 of outer tube 72. The inside diameter of first inner circumferential surface 82 is slightly larger than the outer diameter of flange section 80 of solder cup 70; the inside diameter of second inner circumferential surface 84 is slightly larger than the outer diameter of the tubular section of solder cup 70. Further, the end of the bottom side of solder cup 70 is engaged from the opening of outer tube 72 such that solder cup 70 is stored in outer tube 72. By this, solder cup 70 is slidable inside outer tube 72.

However, the depth dimension of a portion of second inner circumferential surface 84 of outer tube 72 is longer than the length dimension from flange section 80 of solder cup 70 to the bottom surface of solder cup 70, and flange section 80 of solder cup 70 contacts the step surface between first inner circumferential surface 82 and second inner circumferential surface 84 of outer tube 72. Therefore, space 86 is formed between the bottom surface of solder cup 70 and bottom surface 83 of outer tube 72. Note that, outer tube 72 is formed from acrylic resin and is transparent. Therefore, as shown in FIG. 3, solder cup 70 housed inside outer tube 72 can be viewed from outside solder supply device 26. Note that, herein, the bottom surface refers to the surface on the opposite side to the opening of a bottomed cylindrical member. In other words, even if the surface on the opposite side to the opening of a bottomed cylindrical member is positioned towards the top, and the opening is positioned towards the bottom, the surface on the opposite side to the opening is given as the bottom surface, not the lid.

Also, as shown in FIG. 2, supply nozzle 74 is configured from nozzle section 88 and flange section 90; nozzle section 88 and flange section 90 are formed as one body from material that is elastically deformable. Nozzle section 88 is substantially cylindrical with nozzle hole 92 formed running through the inside. Flange section 90 extends in a disk shape from the outer circumferential surface of an end of the nozzle section; the outer diameter of flange section 90 is slightly larger than the inside diameter of solder cup 70. Also, flange section 90 is engaged inside solder cup 70 such that nozzle section 88 faces the opening side of solder cup 70; supply nozzle 74 slides inside solder cup 70 with the outer circumferential section of flange section 90 elastically deformed.

Further, inner tube 76 has cylindrical tube section 96, and ring section 98 that covers the edge of tube section 96; supply nozzle 74 is held by ring section 98. In detail, the outer circumferential surface of nozzle section 88 of supply nozzle 74 is configured from first outer surface 100 positioned on the flange section 90 side and second outer circumferential surface 102 positioned at the tip side of nozzle section 88; the outer diameter of first outer diameter surface 100 is smaller than the outer diameter of second outer circumferential surface 102. On the other hand, the inside diameter of ring section 98 of inner tube 76 is slightly larger than the outer diameter of first outer circumferential surface 100 and slightly smaller than the outer diameter of second outer circumferential surface 102. Also, nozzle section 88 engages with the inside diameter section of ring section 98 while a portion of second circumferential surface 102 is elastically deformed, and the inside diameter of ring section 98 and outer circumferential surface 100 of nozzle section 88 engage. By this, inner tube 76 holds supply nozzle 74 using ring section 98. Note that, inner tube 76 holds supply nozzle 74 using ring section 98, therefore inner tube 76 is positioned inside solder cup 70; however, the end of the side not positioned at ring section 98 of tube section 96 extends from the opening of solder cup 70.

Further, fixed lid 78 has ring section 106, and erected section 108 established around the entire circumference at the outer edge of ring section 106. A screw thread (not shown) is formed on the inner circumferential surface of erected section 108, the screw thread being engaged with the screw thread (not shown) formed at the opening end side of outer tube 72. By this, fixed lid 78 is removably attached to the opening of outer tube 72. Also, the inside diameter of ring section 106 is substantially the same as the inside diameter of tube section 96 of inner tube 76, and the end section that extends from solder cup 70 of tube section 96 is fixed to the inside edge of ring section 106.

Also, through-hole 110 is formed in bottom surface 83 of outer tube 72, and air adapter 112 is attached in through-hole 110. Air adapter 112 is connected to an end of air tube 114, and the other end of air tube 114 is connected to device-side air coupler 116. By connecting slider-side air coupler (refer to FIG. 3) 118 provided at the arrangement position of solder supply device 26 to device-side air coupler 116, air is supplied to space 86 inside outer tube 72, and solder paste is ejected from nozzle hole 92 of supply nozzle 74.

In detail, as shown in FIG. 3, an end of air tube 120 is connected to slider-side air coupler 118, and the other end of air tube 120 is connected to air supply device (refer to FIG. 4) 122. By this, air is supplied from air supply device 122 to space 86 inside outer tube 72. When air is supplied to space 86, the bottom surface of solder cup 70 is pressed towards supply nozzle 74 and solder cup 70 moves down. In this case, the solder paste filling solder cup 70 is compressed and is ejected from nozzle hole 92 of supply nozzle 74. Solder paste ejected from nozzle hole 92 passes through tube section 96 of inner tube 76, and the inner section of ring section 106 of fixed lid 78, and is ejected to the outside of solder supply device 26. Thus, solder supply device 26 supplies solder paste.

Also, as shown in FIG. 3, solder supply device 26 is detachably mounted on X-axis slider 60 by clip lock 130. In detail, bracket 132 is attached to the lower end of X-axis slider 60, and the lower surface of solder supply device 26 is supported by bracket 132. Through-hole (refer to FIG. 2) 133 approximately the same as the inner diameter of ring section 106 of fixed lid 78 of solder supply device 26 is formed in bracket 132. By this, solder paste is supplied from solder supply device 26 loaded on bracket 132 via through-hole 133 in bracket 132.

Two surrounding plates 134 and 136 are fixed on X-axis slider 60 above bracket 132 facing each other and perpendicular to bracket 132. The distance between the two surrounding brackets 134 and 136 is slightly longer than the outer diameter of outer tube 72 of solder supply device 26, and solder supply device 26 is loaded between the two surrounding plates 134 and 136. Also, an end of opening/closing plate 140 is attached to surrounding plate 134 via hinge 138. Lever section 146 of clip lock 130 is provided on the other end of opening/closing plate 140, and hook stopper 148 of clip lock 130 is provided on surrounding plate 136. Also, by performing locking with opening/closing plate 140 in a closed state and lever section 146 latched onto hook stopper 148, solder supply device 26 is fixedly mounted on X-axis slider 60. Also, by releasing the locking of clip lock 130 and opening opening/closing plate 140, solder supply device 26 is able to be removed from X-axis slider 60.

Further, as shown in FIG. 2, photoelectric sensor 150 is provided on X-axis slider 60 so as to face the outer circumferential surface of outer tube 72 of solder supply device 26. Photoelectric sensor 150 emits laser light towards outer tube 72 of solder supply device 26. As described above, because outer tube 72 is transparent, the laser light passes through outer tube 72. On the other hand, because solder cup 70 is not transparent, the laser light reflects off solder cup 70 and photoelectric sensor 150 receives the laser light reflected off solder cup 70. However, if solder cup 70 is not housed in outer tube 72, laser light from photoelectric sensor 150 is not reflected and is not received by photoelectric sensor 150. Thus, it is possible to judge whether solder cup 70 is inside outer tube 72 from a detection value of photoelectric sensor 150.

Figure 4:
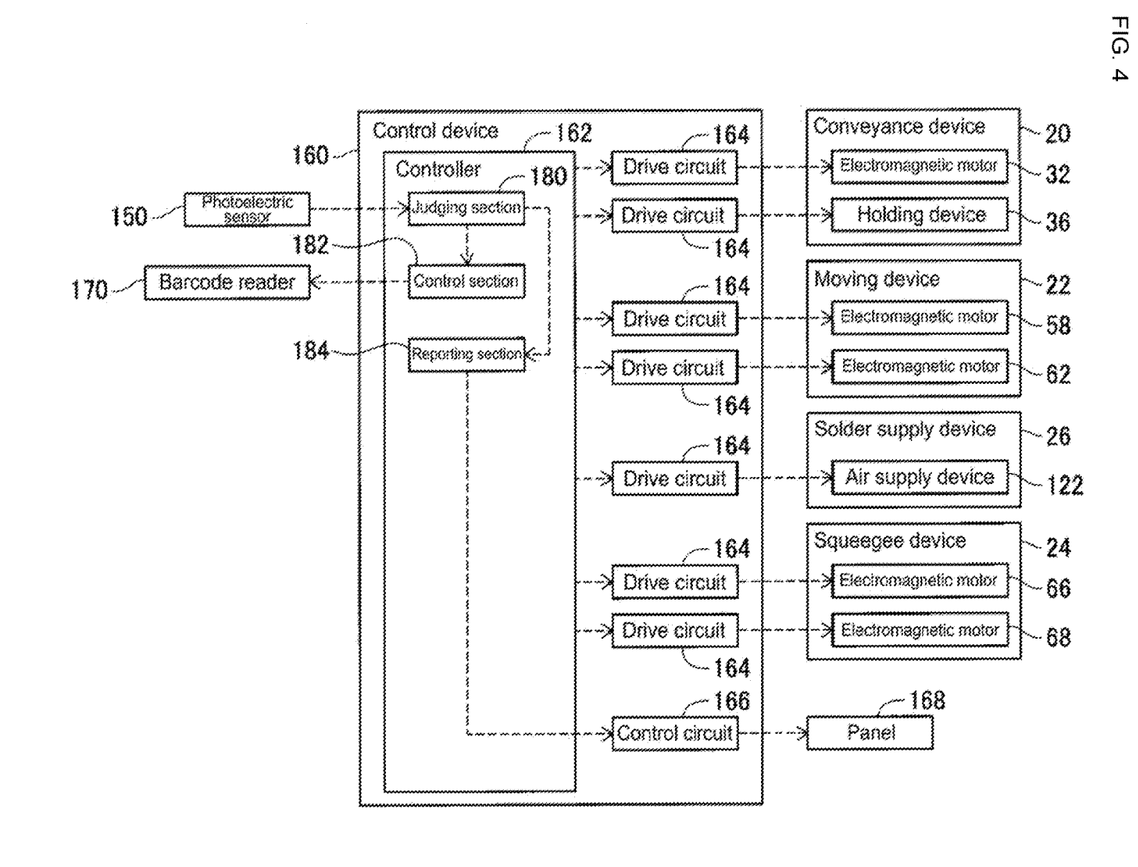
FIG. 4 is a block diagram showing the control device provided in the solder printer of FIG. 1.

Also, as shown in FIG. 4, solder printer 10 is provided with control device 160. Control device 160 is provided with controller 162, multiple drive circuits 164, and control circuit 166. Multiple drive circuits 164 are connected to the above-mentioned electromagnetic motors 32, 58, 62, 66, and 68, holding device 36, and air supply device 122. Also, controller 162 is provided with a CPU, ROM, RAM, and the like, forming the main parts of a computer, and is connected to the multiple drive circuits 164. Thus, the operation of conveyance device 20, moving device 22, squeegee device 24, and solder supply device 26 is controlled by controller 162. Further, controller 162 is connected to photoelectric sensor 150 and acquires detection signals from photoelectric sensor 150.

Also, controller 162 is connected to panel 168 via control circuit 166. Panel 168 is for displaying information required for work by solder printer 10, and is controlled by controller 162. Also, controller 162 is connected to barcode reader 170. Barcode reader 170 is for reading the barcode of identification sticker 81 affixed to a side surface of solder cup 70, and data read by barcode reader 170 is inputted into controller 162.

Printing of Solder Paste to Circuit Board

With solder printer 10, according to the above-described configuration, solder paste is supplied onto the upper surface of a metal mask loaded on circuit board 34 by solder supply device 26, and that solder paste is applied by squeegee device 24. Pattern holes matching the pattern of the pads and so on of circuit board 34 are formed in the metal mask, and solder paste is printed onto circuit board 34 via the pattern holes.

Specifically, based on commands of controller 162, circuit board 34 is conveyed to a work position, and fixedly held at that position by holding device 36. Then, solder supply device 26, based on commands of controller 162, moves to a prescribed position above circuit board 34. Continuing, based on commands of controller 162, solder supply device 26 supplies air from air supply device 122 into space 86 inside outer tube 72. By this, solder paste is ejected from nozzle hole 92, thus supplying solder paste onto the upper surface of the metal mask loaded on circuit board 34. Next, based on commands of controller 162, squeegee device 24 is moved above the location where solder paste was supplied. Then, based on commands of controller 162, squeegee device 24 moves a squeegee down and then moves in the Y-axis direction. By this, solder paste is applied on the upper surface of the metal mask, and solder paste thus enters into the pattern holes. In this manner, solder printer 10 prints solder paste onto circuit board 34.

Exchanging and Verifying Solder Cups

As described above, when printing solder paste onto circuit board 34, solder paste is supplied from solder cup 70 of solder supply device 26; thus, solder cup 70 becomes empty and empty solder cup 70 needs to be replaced with a solder cup 70 filled with solder paste. Thus, with solder supply device 26, it is detected that solder cup 70 has become empty by photoelectric sensor 150.

Figure 5:
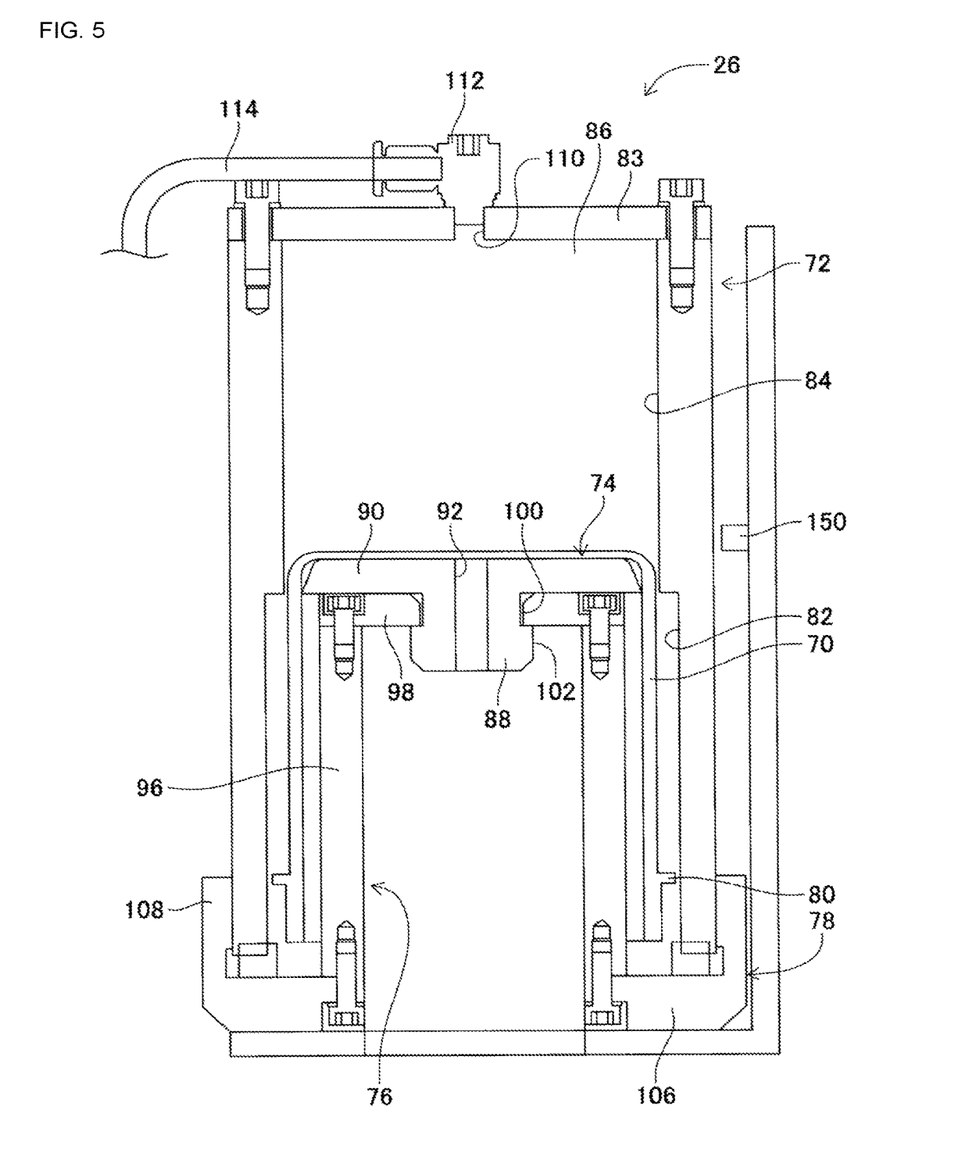
FIG. 5 is a cross-section view showing the solder supply device with an empty solder cup.

Specifically, when supplying solder using solder supply device 26, as described above, air is supplied to space 86 inside outer tube 72 from air supply device 122. By this, the bottom surface of solder cup 70 is pressed towards supply nozzle 74 and solder cup 70 moves down. As shown in FIG. 5, by the downward movement of solder cup 70, the bottom surface of solder cup 70 contacts flange section 90 of supply nozzle 74, and solder cup 70 becomes empty. In this case, solder cup 70 moves below the region exposed to the laser light from photoelectric sensor 150, and photoelectric sensor 150 does not receive reflected laser light. That is, in a state in which the bottom surface of solder cup 70 is not in contact with flange section 90 of supply nozzle 74, that is, in a state in which solder remains in solder cup 70, photoelectric sensor 150 detects received reflected light; however, in a state in which the bottom surface of solder cup 70 is contacting flange section 90 of supply nozzle 74, that is, in a state in which solder cup 70 is empty, photoelectric sensor 150 no longer detects received reflected light.

Thus, the input value inputted to controller 162 from photoelectric sensor 150 changes from a value indicating that light is being received to a value indicating that light is not being received. Thus, controller 162 judges that solder cup 70 has become empty, and displays a screen indicating that solder cup exchange work and verification work should be performed on panel 168. Then, an operator performs solder cup exchange work and verification work based on the display on panel 168.

In detail, the locking of clip lock 130 is released such that opening/closing plate 140 is able to be opened. Also, device-side air coupler 116 is removed from slider-side air coupler 118. Then, solder supply device 26 is removed from X-axis slider 60 and removed from solder printer 10. After solder supply device 26 has been removed from the printer, fixed lid 78 is rotated counterclockwise with respect to outer tube 72 to release the engagement of fixed lid 78 and outer tube 72. By this, fixed lid 78, inner tube 76, supply nozzle 74, and solder cup 70 are removed as one from outer tube 72.

Then, supply nozzle 74 is removed from inside solder cup 70. By this, empty solder cup 70 is removed. Next, a new solder cup 70, that is a solder cup 70 full of solder paste, is set inside outer tube 72 that is in a state with bottom surface 83 pointing down. Then, with supply nozzle 74 engaged inside that solder cup 70, fixed lid 78 is engaged with the opening of outer tube 72. By this, new solder cup 70 is set inside solder supply device 26.

When new solder cup 70 is set in solder supply device 26, solder supply device 26 is drawn into solder printer 10 and loaded on bracket 132. Then opening/closing plate 140 is closed and clip lock 130 is locked. Further, device-side air coupler 116 is attached to slider-side air coupler 118. By this, solder supply device 26 is fixedly attached to X-axis slider 60, thereby completing exchange of solder cup 70.

Continuing, verification work of solder cup 70 is performed. Verification work of solder cup 70 is work of reading the barcode of identification sticker 81 affixed to solder cup 70 by barcode reader 170, and work for checking post-exchange solder cup 70 by reading the barcode. Verification work of solder cup 70 is usually performed before solder cup 70 is housed inside outer tube 72. However, if verification work of solder cup 70 is performed before solder cup 70 is housed inside outer tube 72, it is possible that a solder cup 70 different to the solder cup 70 for which verification work was completed is housed in outer tube 72. That is, for example, an operator may, intending to house solder cup A in outer tube 72, read the barcode of identification sticker 81 of solder cup A with the barcode reader, but then proceed to house solder cup B in outer tube 72.

Therefore, with solder supply device 26, performing verification work of solder cup 70 is only permitted in a case in which solder cup 70 is housed inside outer tube 72 and outer tube 72 is set on X-axis slider 60, that is, only in a case in which solder cup 70 is set in a position at which solder supply is possible. Specifically, reading of a barcode by barcode reader 170 is restricted when solder cup 70 is not detected by photoelectric sensor 150, that is, when solder supply device 26 is not set on X-axis slider 60. Thus, for example, it is not possible to read the barcode of solder cup 70 with barcode reader 170 before solder cup 70 has been set in outer tube 72. Note that, the restriction on reading barcodes by barcode reader 170 may be performed by stopping operation of barcode reader 170, or by discarding or invalidating data read by barcode reader 170, or the like.

In contrast, when a solder supply device 26 for which solder cup 70 exchange work has been completed is set on X-axis slider 60, solder cup 70 is detected by photoelectric sensor 150. By this, the restriction on reading barcodes by barcode reader 170 is lifted. As described above, outer tube 72 of solder supply device 26 is transparent, and as shown in FIG. 3, solder cup 70 housed inside outer tube 72 is viewable from outside outer tube 72. Therefore, identification sticker 81 affixed to solder cup 70 can be viewed from outside outer tube 72, and the barcode on identification sticker 81 can be read by barcode reader 170 from outside outer tube 72. In this way, with solder supply device 26, verification work is able to be performed only for solder cup 70 that is set in a position at which solder supply is possible. Thus, because there is no possibility that a solder cup 70 different to the solder cup 70 for which verification work was completed is set in outer tube 72, it is possible to perform verification work reliably.

Also, as described above, with solder printer 10, a guidance screen for solder cup exchange work and verification work is displayed on panel 168 to match the timing for exchange of solder cup 70. Thus, it is possible to ensure that verification work when exchanging solder cups is not forgotten.

As shown in FIG. 4, controller 162 of control device 160 includes judging section 180, control section 182, and reporting section 184. Judging section 180 is for judging whether solder cup 70 is set at a specified position using a detection value of photoelectric sensor 150. Control section 182 is for performing a restriction on reading barcodes by barcode reader 170 based on the judgment of judging section 180. Reporting section 184 is for displaying a guidance screen for solder cup exchange work and verification work on display 168 to match the timing for exchange of solder cup 70.

Note that, in the above embodiments, solder printer 10 is an example of a solder supply system. Solder supply device 26 is an example of a solder supply device. Solder cup 70 is an example of a solder container. Outer tube 72 is an example of an outer tube. Nozzle section 88 is an example of a nozzle. Flange section 90 is an example of a piston. Photoelectric sensor 150 is an example of a detection sensor. Control device 160 is an example of a control device. Barcode reader 170 is an example of a reading device. Judging section 180 is an example of a judging section. Control section 182 is an example of a reading device control section. Reporting section 184 is an example of a reporting section. A barcode is an example of an identification code.

Further, the present disclosure is not limited to the above example embodiments, and various changed or improved methods of embodiment are possible based on the knowledge of someone skilled in the art. Specifically, for example, in the above embodiment, reading of a barcode by barcode reader 170 is performed manually, but may be performed automatically. In detail, a reading device capable of reading a barcode may be provided on printer 10, and solder supply device 26 may be moved in front of the reading device by the operation of moving device 22. Also, it is also possible to automatically read the barcode of solder cup 70 using the reading device.

Also, in the above embodiment, solder supply device 26 that moves solder cup 70 by supplying air to space 86 demarcated by solder cup 70 and outer tube 72 and so on is used; however, a solder supply device that moves solder cup 70 using a drive source such as a cylinder device or electromagnetic motor may be used.

Also, in the above embodiment, solder supply device 26 with a configuration in which solder cup 70 is housed inside outer tube 72 is used, however, it is possible to use a solder supply device with a configuration such that solder cup 70 is not housed in the housing of solder cup 70 such as outer tube 72, or such that solder cup 70 is housed in some form of housing, but identification sticker 81 affixed to solder cup 70 is exposed. In a case such as this, it is possible to read identification sticker 81 directly using barcode reader 170.

Also, with a solder supply device with a configuration such that solder cup 70 is housed in non-transparent housing, or with a configuration such that solder cup 70 is not housed in housing or is housed in transparent housing but identification sticker 81 affixed to solder cup 70 is not exposed due to an obstruction or the like, it is possible to realize the effects of the present disclosure by using a reading device that reads solder cup 70 by using a sensor that allows the checking of the identification code of solder cup 70 based on magnetism, electromagnetic power, electrostatic capacity or the like, such as an RFID. Note that, in this case, the judging section judges whether solder cup 70 is set in the solder supply device based on the sensor that allows the position of solder cup 70 to be checked based on magnetism, electromagnetic power, electrostatic capacity, or the like.

Also, with the above embodiment, the detection value of photoelectric sensor 150 for detecting that solder cup 70 is empty of solder is used for performing judgment as to whether solder cup 70 is set in solder supply device 26. Thus, when solder cup 70 is empty, it is judged that solder cup 70 is not set in supply device 26 at a position at which solder supply is possible, and reading restrictions are placed on barcode reader 170. However, a detection sensor capable of detecting at least whether solder cup 70 is set on solder supply device 26 regardless of the presence or absence of solder in solder cup 70 may be provided at an appropriate location on solder supply device 26, and judging whether solder cup 70 is set on supply device 26 may be performed using a detection value of that detection sensor. That is, reading of an identification code by a reading device may be allowed so long as solder cup 70 is set on solder supply device 26, even if solder cup 70 is not set at a position at which solder supply is possible.

REFERENCE SIGNS LIST

10: solder printer (solder supply system); 26: solder supply device; 70: solder cup (solder container); 72: outer tube; 88: nozzle section (nozzle); 90: flange section (piston); 150: photoelectric sensor (detection sensor); 160: control device; 170: barcode reader (reading device); 180: judging section; 182: control section (reading device control section); 184: reporting section

The invention claimed is:

1. A solder supply system comprising:
   a solder supply device including
   (a-1) a solder container that is tubular and open at one end and configured to hold liquid solder.
   (a-2) a nozzle, for ejecting solder from the solder container, that is inserted into the solder container, and
   (a-3) a piston that is fixedly provided on an outer circumferential section of the nozzle and that is engaged inside of the solder container from the opening of the solder container,
   wherein the solder supply device supplies solder from the tip of the nozzle by moving at least one of the solder container and the piston such that the piston advances inside the solder container:
   a reading device for reading an identification code affixed to the solder container; and
   a control device including
   (b-1) a judging section configured to judge whether the solder container is set in the solder supply device, and
   (b-2) a reading device control section configured to restrict reading of the identification code by the reading device in a case in which the judging section judges that the solder container is not set in the solder supply device, wherein
   the solder supply device includes an outer tube configured to house the solder container along with the nozzle and the piston, and
   at least a portion of the outer tube is transparent, such that the identification code affixed to the solder container housed inside the outer tube is viewable from outside the outer tube.

2. The solder supply system of claim 1, wherein
   the judging section configured to judge whether the solder container is set in the solder supply device using a detection sensor configured to detect light that passes through the transparent portion of the outer tube.

3. The solder supply system according to claim 1, wherein
   the control device includes a reporting section configured to report a reading request of the identification code by the reading device when the judgment of the judging section changes from a judgment indicating that the solder container is set in the solder supply device to a judgment indicating that the solder container is not set in the solder supply device.

4. The solder supply system according to claim 2, wherein the control device includes a reporting section configured to report a reading request of the identification code by the reading device when the judgment of the judging section changes from a judgment indicating that the solder container is set in the solder supply device to a judgment indicating that the solder container is not set in the solder supply device.

5. A solder supply system comprising:

a solder supply device including
- (a-1) a solder container that is tubular and open at one end and configured to hold liquid solder,
- (a-2) a nozzle, for ejecting solder from the solder container, that is inserted into the solder container, and
- (a-3) a piston that is fixedly provided on an outer circumferential section of the nozzle and that is engaged inside of the solder container from, the opening of the solder container, wherein the solder supply device supplies solder from the tip of the nozzle by moving at least one of the solder container and the piston such that the piston advances inside the solder container;

a reading device for reading an identification code affixed to the solder container; and a control device including
- (b-1) a judging section configured to judge whether the solder container is set in the solder supply device, and
- (b-2) a reading device control section configured to restrict reading of the identification code by the reading device in a case in which the judging section judges that the solder container is not set in the solder supply device, wherein the control device includes a reporting section configured to report a reading request of the identification code by the reading device when the judgment of the judging section changes from a judgment indicating that the solder container is set in the solder supply device to a judgment indicating that the solder container is not set in the solder supply device.

6. The solder supply system according to claim 5, wherein the judging section is configured to judge whether the solder container is set in a position at which solder can be supplied, and the reading device control section is configured to allow reading of the identification code by the reading device in a case in which the judging section judges that the solder container is set in a position at which solder can be supplied.

7. The solder supply system according to claim 5, wherein the solder supply device includes an outer tube configured to house the solder container along with the nozzle and the piston, and at least a portion of the outer tube is transparent, such that the identification code affixed to the solder container housed inside the outer tube is viewable from outside the outer tube.

8. The solder supply system according to claim 5, wherein the control device includes a reporting section configured to report a reading request of the identification code by the reading device when the judgment of the judging section changes from a judgment indicating that the solder container is set in the solder supply device to a judgment indicating that the solder container is not set in the solder supply device.

* * * * *